United States Patent [19]
Sakaue et al.

[11] Patent Number: 4,809,307
[45] Date of Patent: Feb. 28, 1989

[54] CHARGE TRANSFER DEVICE CAPACITOR COUPLED OUTPUT

[75] Inventors: Tatsuo Sakaue; Tatsuya Yoshie, both of Yokohama, Japan

[73] Assignee: Kabushiki Kaisha Toshiba, Kawasaki, Japan

[21] Appl. No.: 31,459

[22] Filed: Mar. 30, 1987

[30] Foreign Application Priority Data

Mar. 31, 1986 [JP] Japan .................................. 61-73457

[51] Int. Cl.⁴ ........................ G11C 19/28; H01L 29/78
[52] U.S. Cl. ......................................... 377/60; 357/24
[58] Field of Search ................................... 377/57–63; 357/24

[56] References Cited

U.S. PATENT DOCUMENTS 4,355,244 10/1982 Benoit-Gonin et al. ............... 377/60
4,631,739 12/1986 Handy ................................... 377/60

Primary Examiner—Gene M. Munson
Attorney, Agent, or Firm—Foley & Lardner, Schwartz, Jeffery, Schwaab, Mack, Blumenthal & Evans

[57] ABSTRACT

A charge transfer device includes a charge transfer unit having a plurality of charge transfer cells for transferring a signal charge by the charge transfer cells, a first floating diffusion region adjacent to the charge transfer unit for storing the signal charge transferred by the charge transfer cells, first control switch means driven by a first reset pulse, and a first reset power source connected to the first floating diffusion region through the first control switch means. The charge transfer device further includes second control switch means driven by a second reset pulse, a second reset power source connected to the second floating diffusion region through the second control switch means, a capacitor coupling the first floating diffusion region to the second floating diffusion region, and detector means for detecting a potential change of the second floating diffusion region to output the potential change as an output signal corresponding to the signal charge. MOS transistors may be employed for the control switches in the output stages. This novel charge transfer device can provide a sufficiently broad output dynamic range and an output signal having a good linearity even when a lower voltage is used for the power supply voltage.

18 Claims, 4 Drawing Sheets

CHARGE TRANSFER DEVICE CAPACITOR COUPLED OUTPUT

BACKGROUND OF THE INVENTION present invention relates to a charge transfer device and, more particularly, to a charge transfer device provided with an improved output circuit.

In recent years, charge transfer devices using charge transfer cells or devices (CTDs) have been employed in the video equipment, e.g., televisions, video disk players (VDPs), and video tape recorders (VTRs) etc. because the broad-band characteristic and the delay characteristic are both excellent. Especially in recent VTRs, high picture quality and frequency broad-band have been developed, and therefore charge transfer devices using CTDs have been widely employed.

With reference to FIG. 1, an explanation will be made in connection with a typical charge transfer device of the system in which the floating diffusion region (FD) system is applied to its output circuit to convert a signal charge transferred by charge transfer cells to a voltage signal to detect it as an output signal. A transfer unit of the charge transfer device is composed of charge transfer cells on which transfer electrodes 1, 2, . . . , 5 are arranged, respectively. A floating diffusion region 21 is provided in a manner that it is adjacent to the transfer electrode 5 of the final stage of the transfer unit. An impurity region 23 is further provided through a gate electrode 22 adjacent to the floating diffusion region 21. This impurity region 23 is connected to a reset power source 24 having a reset voltage $V_{gg}$. Moreover, the above-mentioned floating diffusion region 21 is connected to a detection circuit 6. This detection circuit 16 is configured as a source follower circuit comprising a drive transistor 13, a power source 14 and a constant current source 15.

The operation of the charge transfer device shown in FIG. 1 will be now described in conjunction with the potential profile shown in FIG. 2.

It is now assumed in the charge reset mode that a transfer pulse $\Phi_1$ applied to the transfer electrodes 1 and 2 and a transfer pulse $\Phi_3$ applied to the transfer electrode 5 represent low level, whereas a transfer pulse $\Phi_2$ applied to the transfer electrodes 3 and 4 and a reset pulse $\Phi_2$ applied to the gate electrode 22 represent high level. Thus, as shown in FIG. 2(a), a signal charge $Q_s$ which has been transferred through the transfer unit is stored or accumulated below the transfer electrode 4 and the floating diffusion region 21 is reset to the reset voltage $V_{gg}$.

When the operational mode shifts to the charge detection mode, the transfer pulses $\Phi_1$ and $\Phi_3$ become high level, and the transfer pulse $\Phi_2$ and the reset pulse $\Phi_2$ become low level. Accordingly, the signal charge $Q_s$ stored below the transfer electrode 4 is transferred to the floating diffusion region 21 as shown in FIG. 2(b). By the signal charge $Q_s$, the floating diffusion region 21 produces a potential change $\Delta V$ expressed as follows:

$$\Delta V = Q_s \cdot C_o$$

where $C_o$ denotes an output capacity of the charge transfer cell. The potential change $\Delta V$ of the floating diffusion region 21 is detected by the detection circuit 16 as an output signal.

Meanwhile, since there is a tendency that the power supply voltage of the circuit system in portable VTRs or the like is caused to be equal to a low voltage such as 5 volts, it is now strongly required for the charge transfer devices assembled therein as well to operate at a low voltage. On the other hand, it is required for the first stage of a video amplifier responsive to an output signal of the charge transfer device that the source follower of the detection circuit 16 operates with it having a good linearity.

Assuming now that a reset voltage, a power supply voltage of the power source 14 of the detection circuit 16, and a threshold voltage of the drive transistor 13 are represented by $V_{gg}$, $V_{DD}$ and $V_{th}$, respectively, the drive transistor 13 is required to operate in a saturated region in order that the source follower of the detection circuit 16 maintains linearity. To meet this, the following relationship must hold:

$$V_{gg} - V_{th} < V_{DD}.$$

In this instance, if the power supply voltage $V_{DD}$ is lowered owing to the requirement of allowing the power supply voltage to be reduced, it is required to lower the reset voltage $V_{gg}$ or to change the threshold voltage $V_{th}$ of the drive transistor 13. However, if the reset voltage $V_{gg}$ is lowered, the output dynamic range of the charge transfer cell becomes narrow. To avoid this, the reset voltage $V_{gg}$ is increased by a step-up circuit to widen the dynamic range. However, When such a countermeasure is taken, the linearity of the source follower of the detection circuit 16 becomes degraded in turn.

As just described above, the drawback with the conventional charge transfer device is that the output dynamic range of the charge transfer cell becomes narrow according as the power supply voltage lowers, or the linearity of the detection circuit for detecting an output signal becomes degraded.

SUMMARY OF THE INVENTION

An object of the present invention is to provide a charge transfer device capable of providing a sufficiently broad output dynamic range and of providing an output signal having a good linearity.

The above object is achieved by a charge transfer device comprising a charge transfer unit including a plurality of charge transfer cells for transferring a signal charge by the charge transfer cells, a first floating diffusion region adjacent to the charge transfer unit for storing the signal charge transferred by the charge transfer cells, first control switch means driven by a first reset pulse, a first reset power source connected to the first floating diffusion region through the first control switch means, a second floating diffusion region, second control switch means driven by a second reset pulse, a second reset power source connected to the second floating diffusion region through the second control switch means, a capacitor coupling the first floating diffusion region to the second floating diffusion region, and detector means for detecting a potential change of the second floating diffusion region to output it as an output signal corresponding to the signal charge.

DETAILED DESCRIPTION OF THE INVENTION

Figure 1:
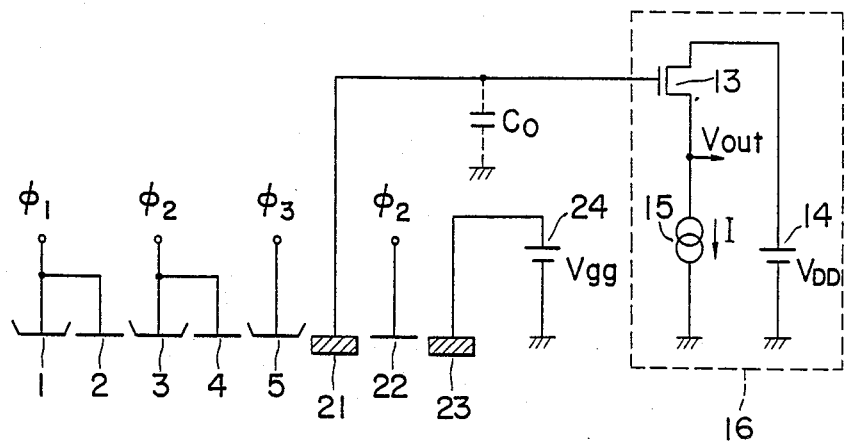
FIG. 1 is a circuit diagram illustrating a conventional charge transfer device.
Figure 2A:
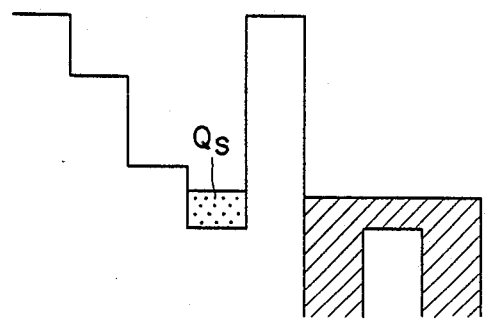
FIGS. 2(a) and 2(b) show a potential profile for explaining the conventional charge transfer device.
Figure 2B:
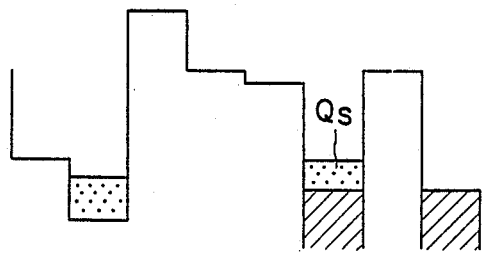
Figure 3:
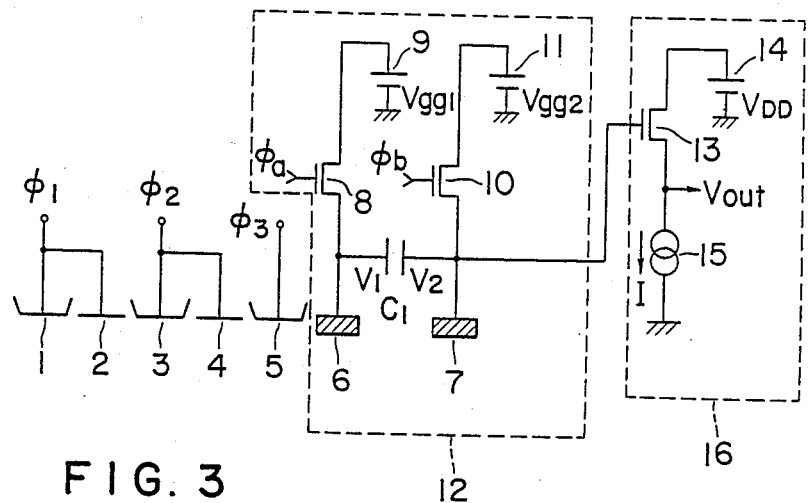
FIG. 3 is a circuit diagram illustrating a first embodiment of a charge transfer device according to the present invention.

A circuit arrangement of a first embodiment of a charge transfer device according to the present invention is shown in FIG. 3. The transfer unit of the charge transfer device is composed of, e.g., n-channel charge transfer cells formed on a semiconductor substrate. On these charge transfer cells, transfer electrodes 1, 2, ..., 5 are arranged, respectively.

In a manner adjacent to the transfer electrode 5 of the final stage of the transfer unit, n-type floating diffusion regions 6 and 7 are provided. These floating diffusion regions 6 and 7 are connected to each other through a capacitor $C_1$. The floating diffusion region 6 is connected to a reset power source 9 through a control switch 8 driven by a reset pulse $\Phi_a$. Likewise, the floating diffusion region 7 is connected to a reset power source 11 through a control switch 10 driven by a reset pulse $\Phi_b$. These reset power sources 9 and 11 have reset voltages $V_{gg1}$ and $V_{gg2}$, respectively. The above-mentioned floating diffusion regions 6 and 7, the Capacitor $C_1$, the control switches 8 and 10, and the reset power sources 9 and 11 constitute an output circuit 12 of the charge transfer device.

The floating diffusion region 7 of the output circuit 12 is connected to the gate of the drive transistor 13. The drain of the drive transistor 13 is connected to a power source 14 having a voltage $V_{DD}$ and the source thereof is grounded through a constant current source 15. Further, the source of the drive transistor 13 is connected to an output terminal $V_{OUT}$. The source follower comprising the drive transistor 13, the power source 14 and the constant current source 15 constitutes a detection circuit 16 of the charge transfer device.

The operation of the device thus configured will be described with reference to FIG. 4.

When transfer pulses $\Phi_1$ and $\Phi_2$ are applied to the transfer electrodes 1, 2, ..., 4 in the transfer unit of the charge transfer device, a signal charge is transferred in turn.

Figure 4A:
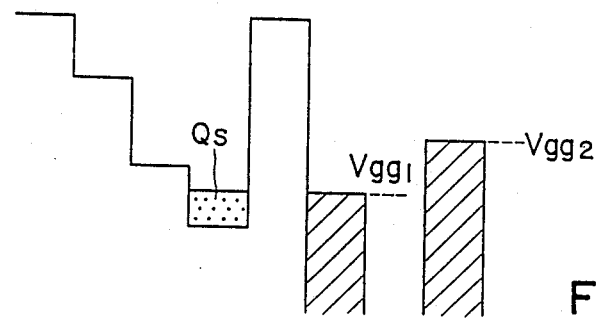
FIGS. 4(a) and 4(b) show a potential profile for explaining the charge transfer device shown in FIG. 3.

It is now assumed in the charge reset mode that the transfer pulse $\Phi_1$ applied to the transfer electrodes 1 and 2 represents low level and the transfer pulse $\Phi_2$ applied to the transfer electrodes 3 and 4 represents high level. Thus, a signal charge $Q_s$ having been transferred as shown in FIG. 4(a) is stored below the transfer electrode 4. At this time, the transfer pulse $\Phi_3$ applied to the transfer electrode 5 of the final stage of the transfer unit becomes low level, so that the transfer from the transfer unit to the floating diffusion region 6 is prevented. Simultaneously with this, the reset pulses $\Phi_a$ and $\Phi_b$ drive the control switches 8 and 10, whereby the floating diffusion regions 6 and 7 are reset to reset voltages $V_{gg1}$ and $V_{gg2}$, respectively. Namely, potentials $V_1$ and $V_2$ of the floating diffusion regions 6 and 7 are respectively expressed as follows:

$$V_1 = V_{gg1}, \text{ and}$$

$$V_2 = V_{gg2}.$$

Figure 4B:
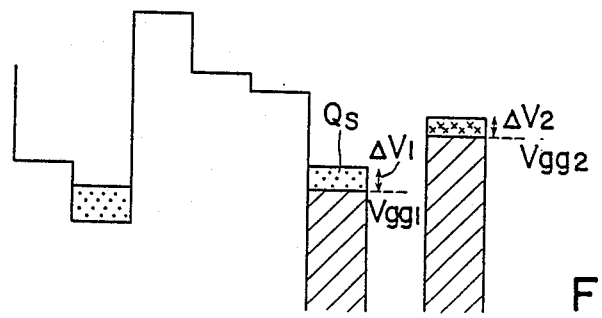

When the operational mode shifts to the charge detection mode, the reset pulses $\Phi_a$ and $\Phi_b$ become operative, thus allowing the floating diffusion regions 6 and 7 to be cut off from the reset power sources 9 and 11, respectively. The transfer pulse $\Phi_3$ applied to the transfer electrode 5 becomes high level. Thus, the signal charge $Q_s$ stored below the transfer electrode 4 as shown in FIG. 4(b) is transferred to the floating diffusion region 6. By the signal charge thus transferred, a potential change $\Delta V_1$ occurs in the floating diffusion region 6. Namely, a potential $V_1$ of the floating diffusion region 6 is expressed as follows:

$$V_1 = V_{gg1} + \Delta V_1$$

where $\Delta V_1 < 0$.

The potential change $\Delta V_1$ in the floating diffusion region 6 causes a potential change $\Delta V_2$ in the floating diffusion region 7 through the capacitor $C_1$. This potential change $\Delta V_2$ is expressed as follows:

$$\Delta V_2 = \alpha \cdot \Delta V_1$$

where the coefficient $\alpha$ is determined by the capacity $C_1$ and a parasitic capacity produced in the floating diffusion region 7. Thus, a potential $V_2$ of the floating diffusion region 7 is expressed as follows:

$$V_2 = V_{gg2} + \Delta V_2$$
$$= V_{gg2} + \alpha \cdot \Delta V_1.$$

At this stage, the value of the potential $V_{gg2}$ is set to an optimum operating point of the source follower comprising the drive transistor 13, the power source 14 and the constant current source 15, whereby the detection circuit 16 detects the potential change $\Delta V_2$ ($=\alpha \cdot \Delta V_1$) of the floating diffusion region 7 as an output signal under condition where the source follower has a good linearity.

As just described above, the charge transfer device according to this embodiment is provided with two floating diffusion regions 6 and 7, thereby making it possible to set the reset voltage $V_{gg1}$ for the floating diffusion region 6 at a higher value so that the dynamic range of the floating diffusion region 6 is sufficiently broad, and to set the reset voltage $V_{gg2}$ for the floating diffusion region 7 so that the source follower of the detection circuit 16 operates at an optimum operating point where the source follower has a good linearity. For this reason, where the power supply voltage of the charge transfer device is caused to be low, by setting two reset voltages $V_{gg1}$ and $V_{gg2}$ to respective appropriate values so as to satisfy the relationship expressed as $V_{gg1} > V_{gg2}$, it is possible to provide a sufficiently broad dynamic range of the floating diffusion region 6, and to allow the source follower of the detection circuit 16 to have a good linearity. In addition, where the power supply voltage of the charge transfer device is not particularly caused to be low, it is sufficient that two reset voltages $V_{gg1}$ and $V_{gg2}$ are set so that the relationship expressed as $V_{gg1}=V_{gg2}$ holds.

Figure 5:
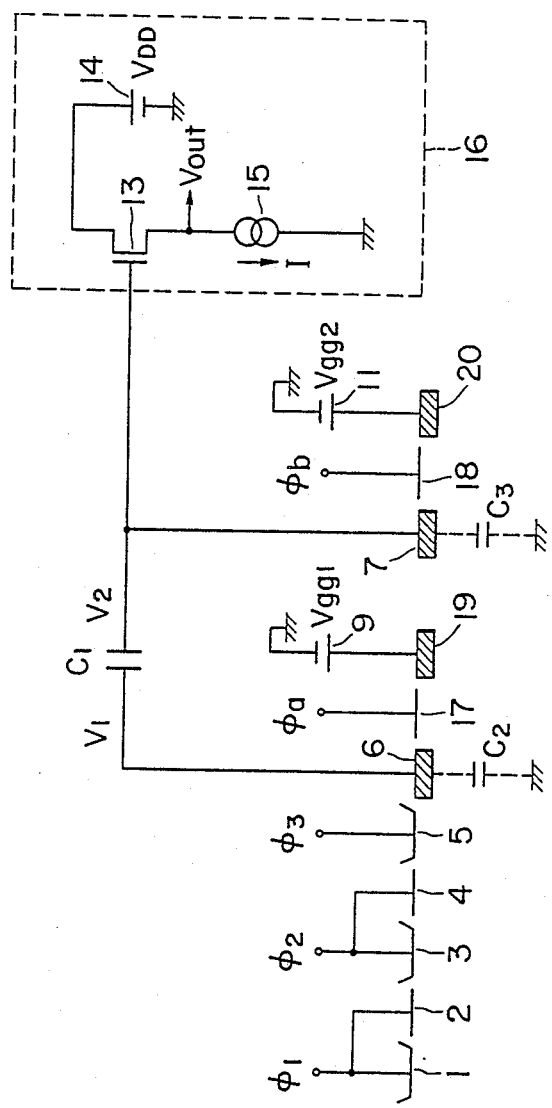
FIG. 5 is a circuit diagram illustrating a second embodiment of a charge transfer device according to the present invention.

Referring now to FIG. 5, there is shown a second embodiment of a charge transfer device according to the present invention. This embodiment is characterized in that MOS (Metal Oxide Semiconductor) transistors constituted with impurity regions connected to the floating diffusion regions 6 and 7 through their gates are used for the control switches 8 and 10 in the first embodiment, respectively.

In the transfer unit comprising n-channel charge transfer cells, transfer electrodes 1, 2, . . . , 5 are arranged. In a manner adjacent to the transfer electrode of the final stage of the transfer unit, n-type floating diffusion regions 6 and 7 are provided. These floating diffusion regions 6 and 7 are connected to each other through the capacitor $C_1$, and have parasitic capacitors $C_2$ and $C_3$, respectively. Moreover, n-type impurity regions 19 and 20, which are adjacent to the floating diffusion regions 6 and 7 and provided through respective gate electrodes 17 and 18, are connected to the reset power source 9 and 11, respectively. These reset power sources 9 and 11 have reset voltages $V_{gg1}$ and $V_{gg2}$, respectively. In addition, the floating diffusion region 7 is connected to the detection circuit 16.

Figure 6A:
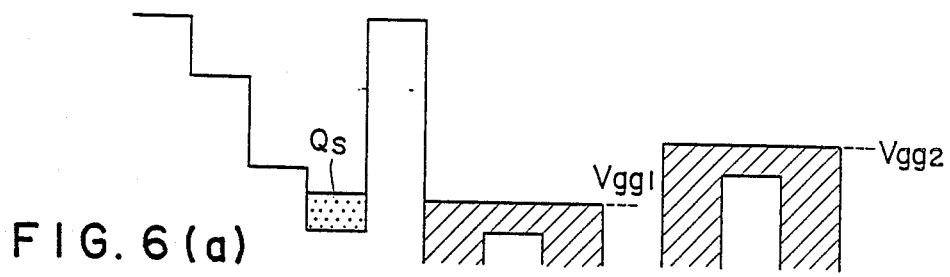
FIGS. 6(a) and 6(b) show a potential profile for explaining the charge transfer device shown in FIG. 5.
Figure 6B:
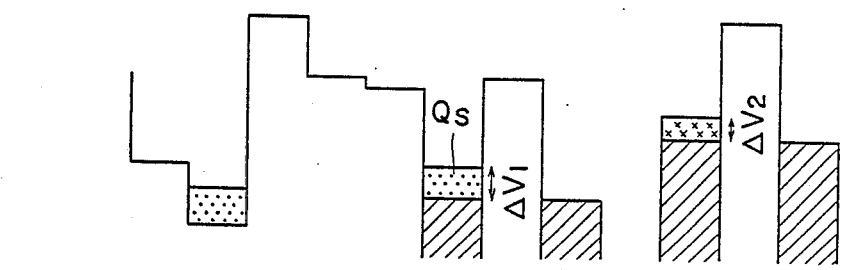
Figure 7:
FIG. 7 is a pulse timing chart for explaining the charge transfer device shown in FIG. 5.
Figure 7:
Figure 7:
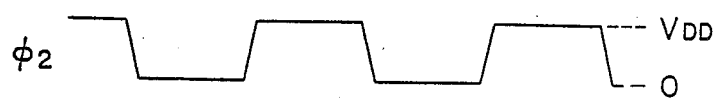

The operation of the device thus configured will be described with reference to FIGS. 6 and 7. FIG. 6 shows the potential profile of the charge transfer device shown in FIG. 5. FIG. 7 is a pulse timing chart of transfer pulses $\Phi_1$ and $\Phi_2$ and reset pulses $\Phi_a$ and $\Phi_b$. When transfer pulses $\Phi_1$ and $\Phi_2$ as shown in FIG. 7 are applied to the transfer electrodes 1, 2, . . . , 4 arranged on the charge transfer cells, a signal charge is transferred in turn in the transfer unit.

The following assumption is made in the charge reset mode. When the pulse timing shown in FIG. 7 is employed, the reset pulses $\Phi_a$ and $\Phi_b$ applied to the respective gate electrodes 17 and 18 both represent high level (voltage $V_{DD}$), the transfer pulse $\Phi_1$ applied to the transfer electrodes 1 and 2 represents low level (voltage of zero), and the transfer pulse $\Phi_2$ applied to the transfer electrodes represents high level (voltage $V_{DD}$). For this reason, the floating diffusion regions 6 and 7 become conductive with the n-type impurity regions 19 and 20 connected to the respective reset power sources 9 and 11 as shown in FIG. 6(a). Thus, they are reset to reset voltages $V_{gg1}$ and $V_{gg2}$, respectively. The signal charge $Q_s$ which has been transferred is stored below the transfer electrode 4 as shown in FIG. 6(a). The signal charge $Q_s$ and the floating diffusion region 6 are cut off from each other by the application of the transfer pulse $\Phi_3$ of low level to the transfer electrode 5 of the final stage of the transfer unit.

When the operational mode shifts to the charge detection mode, the reset pulses $\Phi_a$ and $\Phi_b$ become low level (voltage of zero), the transfer pulse $\Phi_1$ becomes high level (voltage $V_{DD}$), and the transfer pulse $\Phi_2$ becomes low level (voltage of zero) in the pulse timing shown in FIG. 7. For this reason, the floating diffusion regions 6 and 7 are cut off from the n-type impurity regions 19 and 20 as shown in FIG. 6(b), respectively, whereby they are brought into the floating condition. At this time, the signal charge $Q_s$ stored below the transfer electrode 4 is transferred to the floating diffusion region 6 as shown in FIG. 6(b) by the application of the transfer pulse $\Phi_3$ of high level to the transfer electrode 5. By the signal charge $Q_s$ thus transferred, a potential change $\Delta V_1$ is produced. Thus, a potential $V_1$ of the floating diffusion region 6 changes from a value expressed as $V_1=V_{gg1}$ to a value expressed as $V_1=V_{gg1}+\Delta V_1$ where $\Delta V_1 < 0$.

The potential change $\Delta V_1$ of the floating diffusion region 6 causes a potential change $\Delta V_2$ in the floating diffusion region 7. This potential change $\Delta V_2$ is expressed as follows:

$$\Delta V_2 = \frac{C_1}{C_1 + C_3} \cdot \Delta V_1.$$

Thus, a potential $V_2$ of the floating diffusion region 7 changes from a value expressed as $V_2=V_{gg2}$ to a value expressed below.

$$\begin{aligned} V_2 &= V_{gg2} + \Delta V_2 \\ &= V_{gg2} + \frac{C_1}{C_1 + C_3^1} \cdot \Delta V_1 \end{aligned}$$

Then, the potential change $\Delta V_2$ $\{=[C_1/(C_1+C_3)] \cdot \Delta V_1\}$ of the floating diffusion region 7 is detected by the detection circuit 16 as an output signal.

In this case, assuming that a change of an input voltage is represented by $\Delta V_i$, an output voltage change of the floating diffusion region 7 is represented by $\Delta V_2$, and an input capacity of the charge transfer device is represented by $C_{in}$, a gain G of the charge transfer device of this outputting system is expressed as follows:

$$\begin{aligned} G_1 &= \frac{\Delta V_2}{\Delta V_i} \\ &= \frac{C_1}{C_1 + C_3} \cdot \frac{\Delta V_1}{\Delta V_i} \\ &= \frac{C_{in}}{C_2 + C_3 + \frac{C_2 \cdot C_3}{C_1}}. \end{aligned}$$

As apparent from the above equation, by allowing the coupling capacity $C_1$ to be large and allowing the parasitic capacity $C_3$ to be small, the value of the gain can be equal to a value approximate to the gain $G_2$ of the charge transfer device of the conventional system, which is expressed below:

$$G_2 = \frac{C_{in}}{C_2}.$$

As just described above, the charge transfer device according to this embodiment has an arrangement such that one transistor and one capacitor are newly added to the output circuit of the conventional charge transfer device. Thus, even in the case where the power supply voltage is caused to be low, this arrangement permits the floating diffusion region 6 to have a sufficiently broad dynamic range and also permits the source follower of the detection circuit 16 to have a good linearity.

While gate electrodes 17 and 18 and n-type impurity regions 19 and 20 are provided respectively adjacent to the floating diffusion regions 6 and 7 in the abovementioned second embodiment, MOS transistors may be provided at positions which are not adjacent to the floating diffusion regions 6 and 7, thus allowing these transistors to serve as control switches.

Moreover, while the reset pulses $\Phi_a$ and $\Phi_b$ are identical to each other in the above-mentioned second embodiment, it is not necessarily required that they are the same.

In addition, while n-channel charge transfer cells are employed in the above-mentioned first and second embodiments, p-channel charge transfer cells may be employed for the same purpose. In this case, it is necessary that the floating diffusion regions 6 and 7 are of p-type impurity conductivity and the polarity of the potential is opposite to that in the n-channel charge transfer devices.

As apparent from the foregoing description, the charge transfer device according to the present invention makes it possible to allow the output dynamic range to be sufficiently large and to allow the detection circuit for an output signal to be operated under condition of good linearity.

What is claimed is:

1. A charge transfer device comprising:
   a charge transfer unit for transferring a signal charge by said charge transfer cells, said charge transfer unit having a plurality of charge transfer cells;
   a first floating diffusion region adjacent to said charge transfer unit for storing said signal charge transferred by said charge transfer cells;
   first control switch means driven by a first reset pulse;
   a first reset power source connected to said first floating diffusion region through said first control switch means;
   a second floating diffusion region;
   second control switch means driven by a second reset pulse;
   a reset power source connected to said second floating diffusion region through said second control switch means;
   a capacitor coupling said first floating diffusion region to said second floating diffusion region; and
   detector means for detecting a potential change of said second floating diffusion region to output said potential change as an output signal corresponding to said signal charge.

2. A charge transfer device as set forth in claim 1, wherein
   said first control switch means is a first field effect transistor having a first impurity region connected to said first reset power source, a second impurity region connected to said first floating region, and a first control electrode formed on a channel region between said first and second impurity regions, said first reset pulse being input to said first control electrode, and
   said second control switch means is a second field effect transistor having a third impurity region connected to said second reset power source, a fourth impurity region connected to said second floating region, and a second control electrode formed on a channel region between said third and fourth impurity regions, said second reset pulse being input to said second control electrode.

3. A charge transfer device as set forth in claim 2, wherein said first reset power source has a potential larger than that of said second reset power source.

4. A charge transfer device as set forth in claim 2, wherein said first and second reset pulses are identical to each other.

5. A charge transfer device as set forth in claim 2, wherein said detector means comprises a source follower circuit including a field effect transistor having a gate connected to said second floating diffusion region.

6. A charge transfer device as set forth in claim 5, wherein said first reset power source has a potential larger than that of said second reset power source.

7. A charge transfer device as set forth in claim 5, wherein said first and second reset pulses are identical to each other.

8. A charge transfer device as set forth in claim 1, wherein
   said first control switch means including a first impurity region connected to said first reset power source, and a first control electrode formed on a channel region between said first impurity region and said first floating diffusion region, said first reset pulse being input to said first control electrode, and
   said second control switch means including a second impurity region connected to said second reset power source, and a second control electrode formed on a channel region between said second impurity region and said second floating diffusion region, said second reset pulse being input to said second control electrode.

9. A charge transfer device as set forth in claim 8, wherein said first reset power source has a potential larger than that of said second reset power source.

10. A charge transfer device as set forth in claim 8, wherein said first and second reset pulses are identical to each other.

11. A charge transfer device as set forth in claim 8, wherein said detector means comprises a source follower circuit including a field effect transistor having a gate connected to said second floating diffusion region.

12. A charge transfer device as set forth in claim 11, wherein said first reset power source has a potential larger than that of said second reset power source.

13. A charge transfer device as set forth in claim 11, wherein said first and second reset pulses are identical to each other.

14. A charge transfer device as set forth in claim 1, wherein said first reset power source has a potential larger than that of said second reset power source.

15. A charge transfer device as set forth in claim 1, wherein said first and second reset pulses are identical to each other.

16. A charge transfer device as set forth in claim 1, wherein said detector means comprises a source follower circuit including a field effect transistor having a gate connected to said second floating diffusion region.

17. A charge transfer device as set forth in claim 16, wherein said first reset power source has a potential larger than that of said second reset power source.

18. A charge transfer device as set forth in claim 16, wherein said first and second reset pulses are identical to each other.

* * * * *